United States Patent
Takano et al.

(10) Patent No.: US 8,309,494 B2
(45) Date of Patent: Nov. 13, 2012

(54) IRON-BASED SUPERCONDUCTING SUBSTANCE

(75) Inventors: Yoshihiko Takano, Tsukuba (JP); Yoshikazu Mizuguchi, Tsukuba (JP)

(73) Assignee: National Institute for Materials Science, Tsukuba-Shi (JP)

( * ) Notice: Subject to any disclaimer, the term of this patent is extended or adjusted under 35 U.S.C. 154(b) by 0 days.

(21) Appl. No.: 12/998,561

(22) PCT Filed: Nov. 4, 2009

(86) PCT No.: PCT/JP2009/068853
§ 371 (c)(1),
(2), (4) Date: May 3, 2011

(87) PCT Pub. No.: WO2010/053103
PCT Pub. Date: May 14, 2010

(65) Prior Publication Data
US 2011/0207610 A1    Aug. 25, 2011

(30) Foreign Application Priority Data
Nov. 4, 2008   (JP) ................................. 2008-282673

(51) Int. Cl.
*H01L 39/24*    (2006.01)
(52) U.S. Cl. ....................................................... 505/124
(58) Field of Classification Search .................. 505/124, 505/775; 423/508, 511
See application file for complete search history.

(56) References Cited

U.S. PATENT DOCUMENTS

| 8,055,318 | B1 * | 11/2011 | Kadin | 505/190 |
| 2010/0323899 | A1 * | 12/2010 | Giunchi | 505/166 |

FOREIGN PATENT DOCUMENTS

| JP | S64-017315 | 1/1989 |
| JP | H08-064408 | 3/1996 |

OTHER PUBLICATIONS

"Fabrication of Fe-Te-S Superconducting Epitaxial Thin Films by Pulsed Laser Deposition", Mele et al., Applied Physics Express 2 (Jul. 2009) pp. 073002-1-073002-3.*
"Superconductivity in S-Substituted FeTe", Mizuguchi et al.,Applied Physics Letters 94 (Jan. 2009), pp. 012503-1-012503-3.*
Yoshikazu Mizuguchi et al., "Superconductivity at 27 K in tetragonal FeSe under high pressure", Applied Physics Letters, Oct. 2008, vol. 93, p. 152505-1~152505-3.

* cited by examiner

*Primary Examiner* — Colleen Dunn
(74) *Attorney, Agent, or Firm* — Manabu Kanesaka

(57) ABSTRACT

The invention provides an iron-based superconducting substance capable of bringing about superconductivity without using any toxic elements. The iron-based superconducting substance includes a composition wherein an FeTe alloy is doped with sulfur in such a way as to satisfy the following formula 1.

$Fe(Te_{1-x}S_x)_y$, where $0<x<1$, and $0.8<y\leq 1$    Formula 1

The iron-based superconducting substance takes a tetragonal PbO structure with a space group P4/nmm.

2 Claims, 5 Drawing Sheets

IRON-BASED SUPERCONDUCTING SUBSTANCE

RELATED APPLICATIONS

The present application is National Phase of International Application No. PCT/JP2009/068853 filed Nov. 4, 2009, and claims priority from, Japanese Application No. 2008-282673 filed Nov. 4, 2008, the disclosure of which is hereby incorporated by reference herein in its entirety.

BACKGROUND OF THE INVENTION

1. Field of the Invention

The present invention relates to an iron-based superconducting substance that comprises iron as a main ingredient and exhibits superconductivity.

2. Description of the Prior Art

In the early 2008's, iron-based superconductors have been discovered by a team led by a Tokyo Institute of Technology professor Hosono. With this discovery as a turning point, superconductors comprising similar compounds have been discovered one after another. Those iron-based superconductors are now expected to offer a series of new high-temperature superconductors, with their superconductivity considered to result from a two-dimensional structure comprising iron-arsenic, iron-phosphorus, iron-selenium, etc. For this reason, most of iron-based superconductors thus far identified, include strongly toxic elements such as arsenic, phosphorus, and selenium. For possible applications of the iron-based superconductors, it is still desired to uncover a superconductor made up of elements of less toxicity. Non-Patent Publication 1: ACTA CHEMICA SCANDINAVICA 8, 1927, 1945.

SUMMARY OF THE INVENTION

Object of the Invention

The present invention is directed to an iron-based superconducting substance that brings about superconductivity without using toxic elements.

Means for Achieving the Object

According to a $1^{st}$ aspect of the invention, there is an iron-based superconducting substance provided, which is characterized by a composition wherein an FeTe alloy is doped with sulfur (S) in such a way as to satisfy the following Formula 1.

$Fe(Te_{1-x}S_x)_y$ where $0<x<1$, and $0.8<y\leq 1$  Formula 1

According to a $2^{nd}$ aspect of the invention, the iron-based superconducting substance of the $1^{st}$ aspect is further characterized by a tetragonal PbO structure (having a space group P4/nmm).

Advantages of the Invention

Iron-tellurium (FeTe) compounds are structurally similar to iron-based superconductors but do not exhibit superconductivity. The inventors have succeeded in doping these compounds with a small amount of sulfur thereby bringing about superconductivity. The inventive iron-tellurium based superconductor $FeTe_{1-x}S_x$ contains none of the elements which exhibit high toxicity. For this reason, this superconductor is considered to provide a material that could facilitate research and development and be well compatible with many applications.

Even with compositions that may be described as $FeTe_y$ and contain relatively too little or too much tellurium, stability is achievable.

EMBODIMENTS FOR CARRYING OUT THE INVENTION

Figure 1:
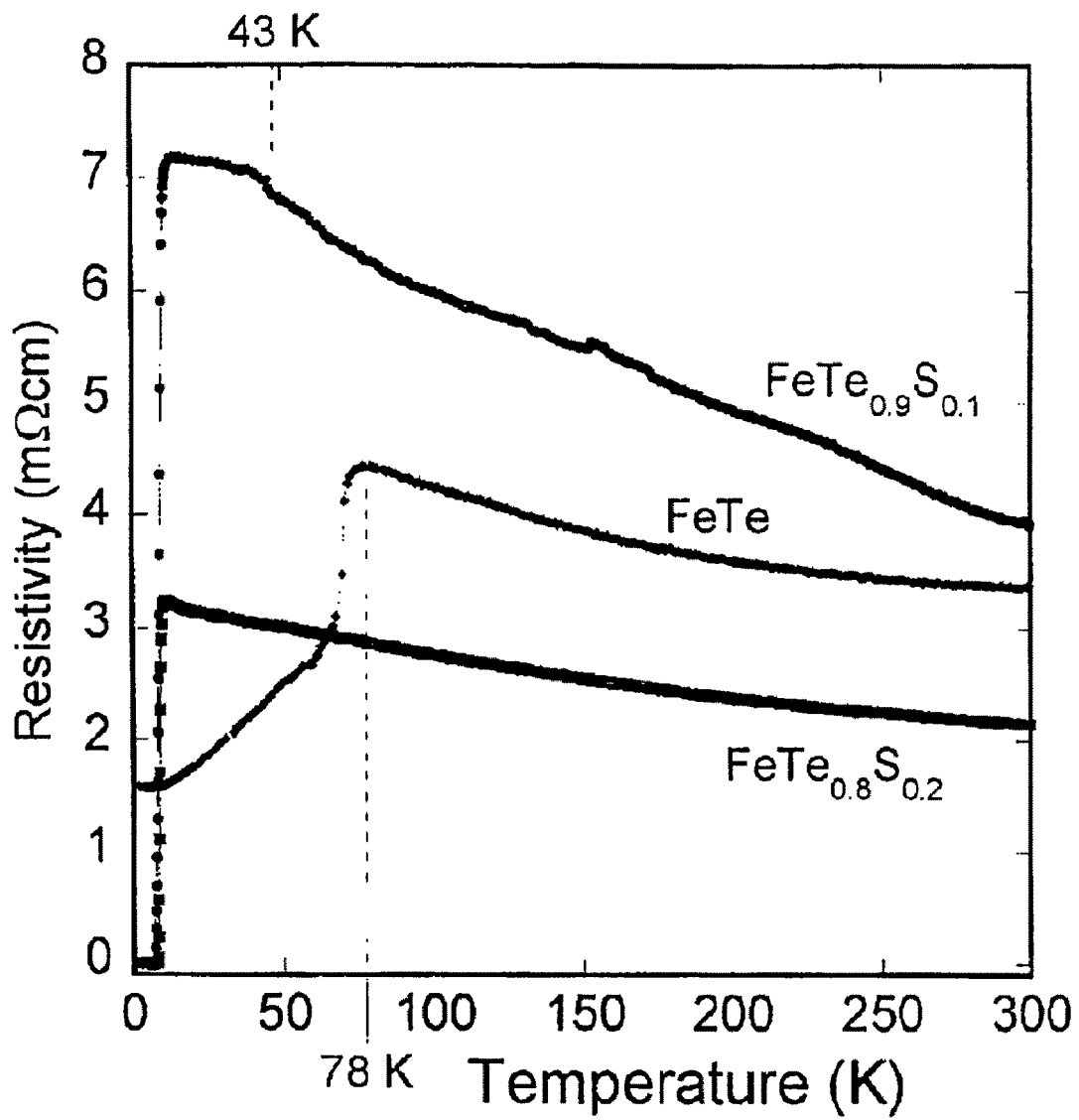
FIG. 1 is a graph indicative of the temperature dependency of electrical resistivity of FeTe relating to Experiments Nos. 1 and 2.
Figure 2:
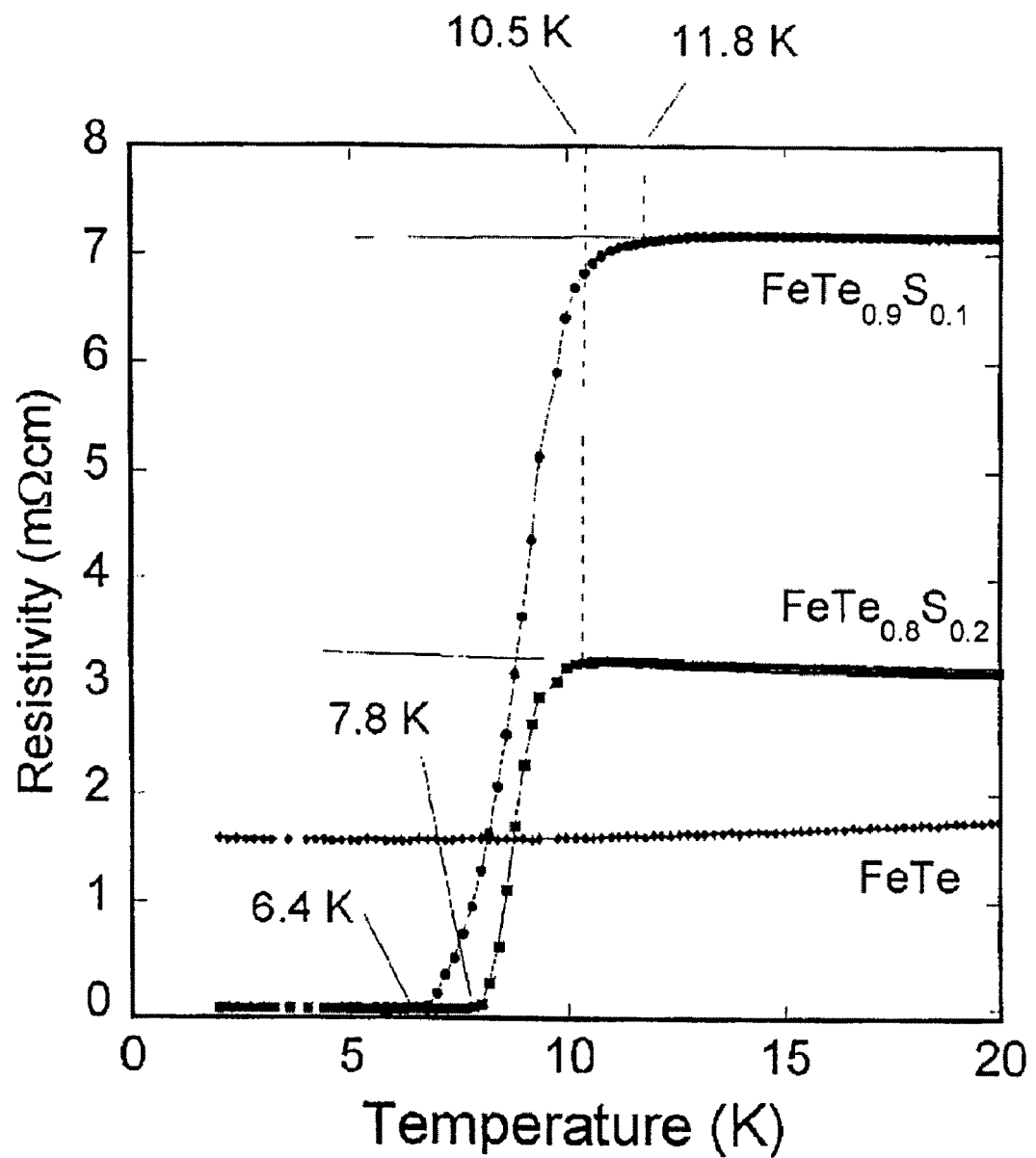
FIG. 2 is an enlarged FIG. 1 graph at low temperature, indicating temperature dependency of electrical resistance of FeTe relating to Experiments Nos. 1 and 2.
Figure 3:
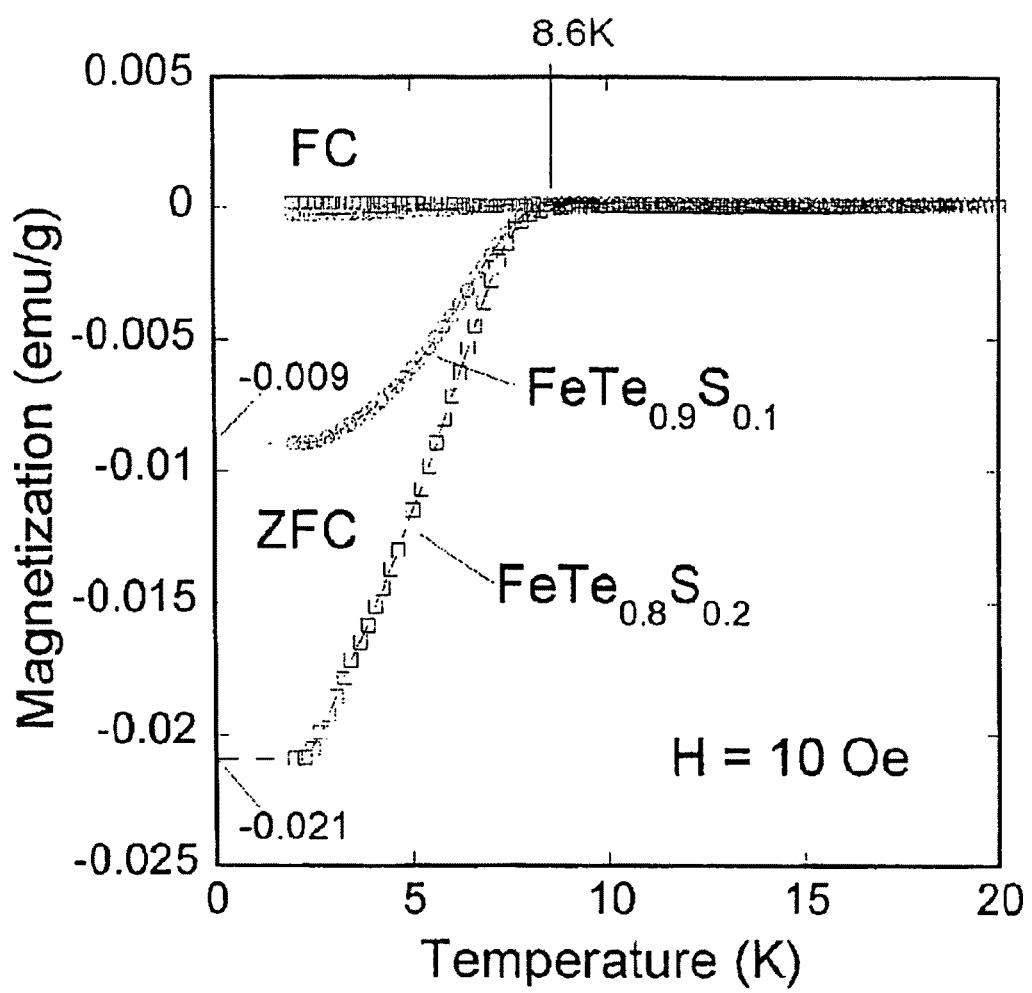
FIG. 3 is illustrative of the temperature dependency of magnetic susceptibility of FeTe according to Experiments Nos. 1 and 2.
Figure 4:
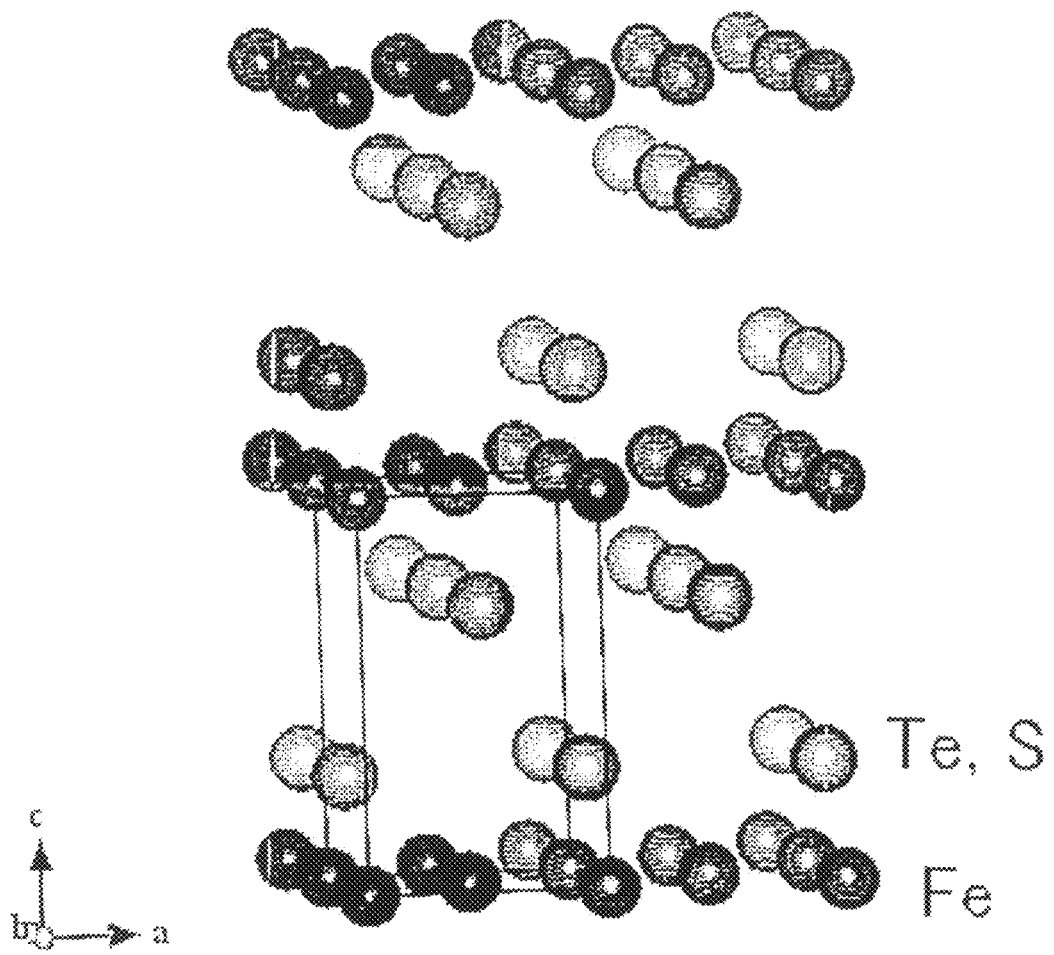
FIG. 4 is a schematic illustration of a crystal structure associated with the FeTe material.
Figure 5:
FIG. 5 is a photograph taken of Experiment No. 2 used for the measurement depicted in FIGS. 1, 2 and 3.

In view of function measurement in the respective examples, the upper limit to x in Formula 1 should be less than 1, preferably 0.8 or less, and more preferably 0.5 or less, and the lower limit should be greater than 0, preferably 0.01 or greater, and more preferably 0.02 or greater.

The small letter y should be $0.8<y\leq 1$, and more preferably $0.9<y\leq 1$.

EXAMPLES

Synthesis Process 1

The starting materials Fe, Te and S were weighed in such a way as to have the ratios shown in Table 1. That is, in a compositional ratio $FeTe_{1-x}S_x$ where x=0.1, 0.2, 0.3, 0.4, 0.5 or $Fe(Te_{1-x}S_x)_{0.92}$ where x=0.1, 0.2, 0.3), and which were mixed together without being ground. Then, the obtained mixture was sealed under vacuum in a quartz glass tube, and heated to 800° C. (in 50° C. increments) and maintained under these conditions for ½ day in an electrical furnace.

The starting materials Fe, Te and S used are given below.

Fe: Fe powder made by Kojundo Chemical Laboratory Co., Ltd. with 99.9% or greater purity and an average particle diameter of 150 μm, Te: Te powder made by Kojundo Chemical Laboratory Co., Ltd. with 99.9% purity and an average particle diameter of 150 μm, and S: S powder made by Kojundo Chemical Laboratory Co., Ltd. with 99.9% or greater purity.

TABLE 1

| Experiment No. | Composition (estimated from the starting materials ratio) | Mixing Ratio (by weight) of the starting materials | | |
|---|---|---|---|---|
| | | Fe | Te | S |
| 1 | $FeTe_{0.9}S_{0.1}$ | 55.85 | 114.84 | 3.206 |
| 2 | $FeTe_{0.8}S_{0.2}$ | 55.85 | 102.08 | 6.412 |
| 3 | $FeTe_{0.7}S_{0.3}$ | 55.85 | 89.32 | 9.0618 |
| 4 | $FeTe_{0.6}S_{0.4}$ | 55.85 | 76.56 | 12.824 |
| 5 | $FeTe_{0.5}S_{0.5}$ | 55.85 | 63.8 | 16.03 |
| 6 | $Fe(Te_{0.9}S_{0.1})_{0.92}$ | 55.85 | 105.65 | 2.95 |
| 7 | $Fe(Te_{0.8}S_{0.2})_{0.92}$ | 55.85 | 93.91 | 5.9 |
| 8 | $Fe(Te_{0.7}S_{0.3})_{0.92}$ | 55.85 | 82.17 | 8.85 |
| 9 | $Fe(Te_{0.6}S_{0.4})_{0.92}$ | 55.85 | 70.435 | 11.8 |
| 10 | $Fe(Te_{0.5}S_{0.5})_{0.92}$ | 55.85 | 58.696 | 14.75 |

Synthesis Process 2

The starting materials Te and S were mixed together in a ratio of 1:1, and the mixture was sealed under vacuum in a quartz glass tube, and heated to 400° C. (in 50° C. increments) and maintained under these conditions for ½ day. The starting materials could be all allowed to react for synthesis of a TeS compound.

The TeS compound was obtained in a gray powder form.

The TeS compound was employed for the following synthesis for the purpose of obviating a problem with evaporation of S alone.

The obtained sample TeS, and Fe and Te were weighed in such a way as to have the ratios shown in Table 2. That is in a compositional ratio $FeTe_{1-x}S_x$ where x=0.1, 0.2, 0.3), and then ground and mixed together in an agate mortar for about 10 minutes. Then, the mixture was sealed under vacuum in a quartz glass tube, and heated to 550 to 600° C. (in 50° C. increments) and maintained thereat for ½ day. The obtained sample was ground, and again sealed under vacuum in a quartz glass tube and then heated to 600° C. (in 50° C. increments) and maintained under these conditions for ½ day.

It is to be noted that the starting materials except the TeS compound were the same as in Synthesis Process 1.

TABLE 2

| Experiment No. | Composition (estimated from the starting materials ratio) | Mixing Ratio (by weight) of the starting materials | | |
|---|---|---|---|---|
| | | Fe | TeS | Te |
| 11 | $FeTe_{0.9}S_{0.1}$ | 55.85 | 15.966 | 102.08 |
| 12 | $FeTe_{0.8}S_{0.2}$ | 55.85 | 31.93 | 76.56 |
| 13 | $FeTe_{0.7}S_{0.3}$ | 55.85 | 47.9 | 51.04 |

Through X-ray structure analysis, the obtained sample was found to have a tetragonal PbO structure as a main ingredient.

All the samples synthesized by the above processes were found to exhibit superconductivity.

Typical results of experimentation are illustrated in the accompanying drawings.

Electrical resistivity was measured by the four-terminal method, and magnetization was measured with a SQUID magnetometer.

The samples obtained by the Synthesis Process 1, each were provided with four terminals at sites whose surfaces were black. These were used to measure electrical resistivity.

The samples obtained by the Synthesis Process 2 were all sintered bodies that were in the same state throughout. Each pellet was broken and configured into a rectangular prism provided with four terminals.

Applicability to the Industry

The inventive iron-based superconducting substance, because it contains no toxic elements, may have applications as superconducting linear motor cars, MRI medical diagnosis systems, superconducting energy storages, superconducting transformers, superconducting cables or the like.

What is claimed is:

1. An iron-based superconducting substance, comprising: iron as a main ingredient and capable of bringing about superconductivity, and comprising a composition in which an FeTe alloy is doped with sulfur to satisfy formula 1:

$Fe(Te_{1-x}S_x)_y$, where $0<x<1$, and $0.8<y\leq 1$   Formula 1.

2. The iron-based superconducting substance as recited in claim 1, wherein the superconducting substance has a tetragonal PbO structure with a space group P4/nmm.

* * * * *